(12) United States Patent
Ohwaki

(10) Patent No.: US 7,271,347 B2
(45) Date of Patent: Sep. 18, 2007

(54) WIRED CIRCUIT BOARD

(75) Inventor: Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/305,120

(22) Filed: Dec. 19, 2005

(65) Prior Publication Data

US 2006/0131065 A1    Jun. 22, 2006

(30) Foreign Application Priority Data

Dec. 21, 2004    (JP) .............................. 2004-369871

(51) Int. Cl.
*H05K 1/16*   (2006.01)
(52) U.S. Cl. ...................... 174/252; 174/260
(58) Field of Classification Search ............... 174/252, 174/260; 361/719
See application file for complete search history.

(56) References Cited

U.S. PATENT DOCUMENTS 5,050,040 A * 9/1991 Gondusky et al. .......... 361/708
5,856,911 A * 1/1999 Riley ......................... 361/704
6,268,239 B1 * 7/2001 Ikeda ......................... 438/122
6,518,518 B1 * 2/2003 Saiki et al. .................. 174/267
6,744,135 B2 * 6/2004 Hasebe et al. .............. 257/712

FOREIGN PATENT DOCUMENTS

| JP | HEI 11-97818 | 4/1999 |
| JP | HEI 11-248032 | 10/1999 |
| JP | 2000-323525 | 11/2000 |

* cited by examiner

*Primary Examiner*—Ishwar (I. B.) Patel
(74) *Attorney, Agent, or Firm*—Akerman Senterfitt; Jean C. Edwards, Esq.

(57) ABSTRACT

A wired circuit board is provided having excellent heat radiation characteristics, including when the semiconductor device is mounted on the wired circuit board by the flip chip mounting method. An insulating base layer defines a base opening portion in a mounting region. The base opening portion includes a thin layer portion that surrounds the base opening portion. Inside terminal portions are disposed on the thin layer portion. A heat radiating portion is formed in the base opening region to contact the stiffener sheet As a result, the surface of the inside terminal portion is located lower in level than the surface of the heat radiating portion. Thus, a semiconductor device may be mounted on the wired circuit board by the flip chip mounting method to enable heat generated from the semiconductor device to be transferred to the stiffener sheet via the heat radiating portion.

4 Claims, 5 Drawing Sheets

(a)

(b)

(c)

(d)

(e)

WIRED CIRCUIT BOARD

BACKGROUND OF THE INVENTION

CROSS REFERENCE TO RELATED APPLICATION

This application claims priority from Japanese Patent Appln. No. 2004-369871, filed Dec. 21, 2004, the contents of which are herein incorporated by reference in their entirety.

FIELD OF THE INVENTION

The present invention relates to a wired circuit board and, more particularly, to a wired circuit board on which semiconductor devices are mounted by a flip chip mounting method.

DESCRIPTION OF THE PRIOR ART

Various mounting methods for mounting semiconductor devices on a wired circuit board are known, including a wire bonding mounting method, a flip chip mounting method, and an anisotropic conductive film mounting method.

Since the semiconductor devices mounted on the wired circuit board generate heat by the passage of electric current, it is a critical issue for the wired circuit board to radiate heat effectively. Various studies on this issue are being made.

For example, in a proposed method, a heat radiation pattern of copper foil wiring is arranged with a wiring pattern in an area of a thermal conductive circuit board corresponding to an active device arranging area of the IC chip, so that the heat generated is radiated from the IC chip to the thermal conductive circuit board effectively (Cf. JP Laid-open (Unexamined) Publication No. 2000-323525, for example).

Also, in another proposed method, for example a conductor being conductive to a metal base and a conductor being non-conductive to the metal base are interconnected via a thermal conducting component having a specific thermal conductivity and thereby the heat generated by electronic components is radiated to the metal base rapidly, to produce improved heat radiation (Cf. JP Laid-open (Unexamined) Publication No. Hei 11-97818, for example).

Meanwhile, in the flip chip mounting method, bumps formed of solder or gold are previously provided in a terminal portion of a conductive pattern, so that the semiconductor device is mounted on the wired circuit board via the bumps. As a result of this, the space between the semiconductor device mounted and the wired circuit board is increased by an amount equivalent to thickness of the bumps, so that even when there is provided the heat radiation pattern or the thermal conducting component, there cannot be expected to provide a sufficient heat radiating effect.

SUMMARY OF THE INVENTION

The present invention provides a wired circuit board that can produce excellent heat radiation characteristics even when the semiconductor device is mounted on the wired circuit board by the flip chip mounting method.

The present invention provides a novel wired circuit board comprising a metal supporting layer, an insulating base layer which is formed on the metal supporting layer and in which an opening portion is formed, a conductive pattern, formed on the insulating base layer, to include a terminal portion for connection with a semiconductor device, and a mounting portion for mounting the semiconductor device thereon, wherein the opening portion and the terminal portion are located in the mounting portion; a heat radiating portion which is in contact with the metal supporting layer is provided in the opening portion; and a surface of the terminal portion is located close to the metal supporting layer with respect to the surface of the heat radiating portion.

In the wired circuit board of the present invention, it is preferable that the surface of the terminal portion is located 1-15 μm closer to the metal supporting layer than the surface of the heat radiating portion.

According to the wired circuit board of the present invention, the surface of the terminal portion is located close to the metal supporting layer with respect to the surface of the heat radiating portion. This construction can provide the result that even when bumps are provided in the terminal portion so that the semiconductor device can be mounted via the bumps, the semiconductor device mounted and the heat radiating portion can be located closer to each other by an amount corresponding to the displacement of the surface of the terminal portion toward the metal supporting layer with respect to the surface of the heat radiating portion. As a result of this, the semiconductor device can be reliably mounted on the wired circuit board by the flip chip mounting method, while also the heat generated from the semiconductor device can be transferred to the metal supporting layer effectively via the heat radiating portion. This can produce the result of providing improved heat radiating ability of the wired circuit board.

DETAILED DESCRIPTION OF THE PREFERRED EMBODIMENT

Figure 1:
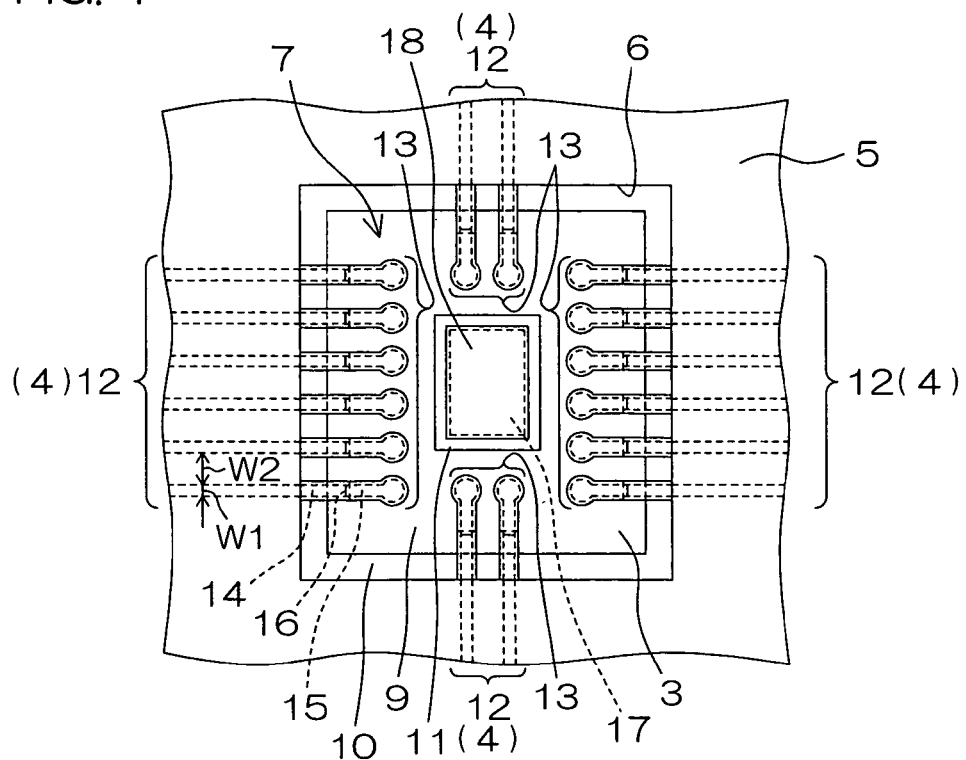
FIG. 1 is a plan view of an embodiment of a wired circuit board of the present invention, showing a principal part of a mounting portion for a semiconductor device to be mounted on, FIG. 2 is a sectional view of the principal part corresponding to FIG. 1.
Figure 2:
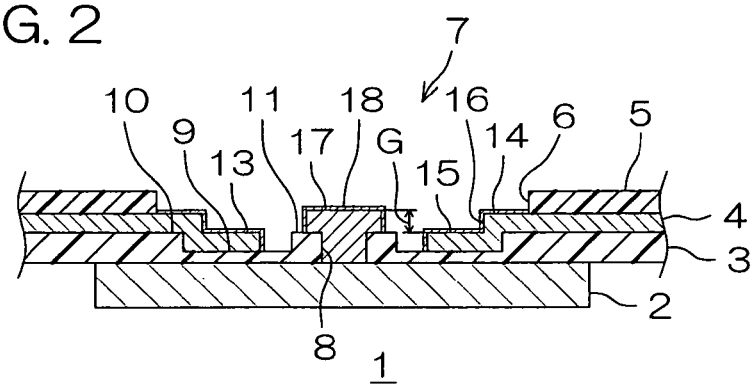
Figure 3:
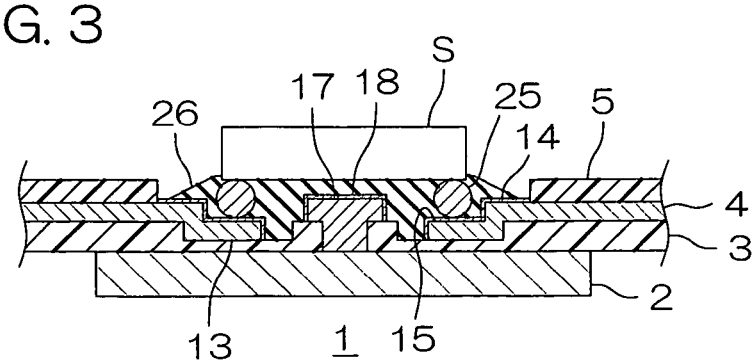
FIG. 3 is a sectional view of the principal part corresponding to FIG. 2, showing the mounted state of the semiconductor device.
Figure 4:
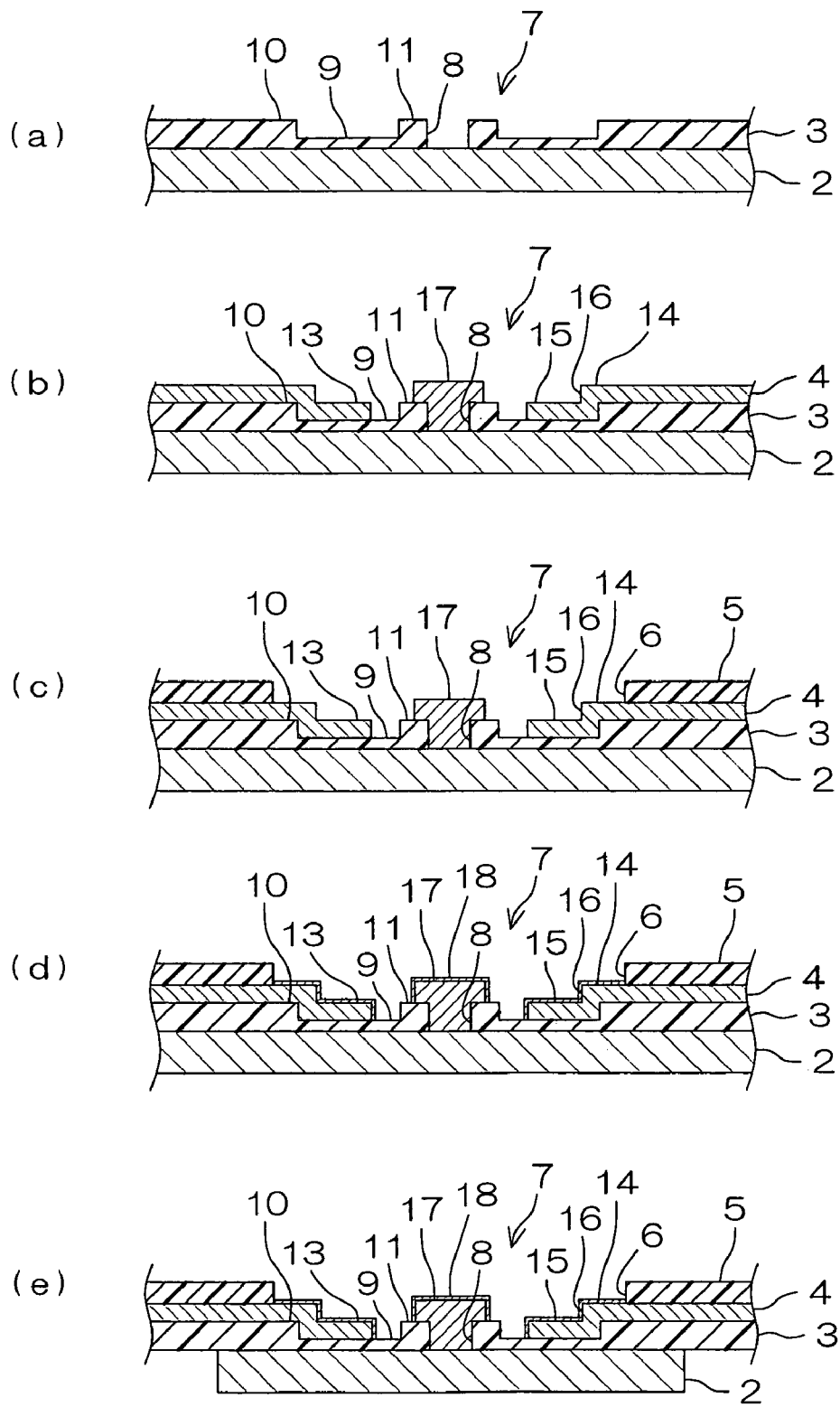
FIG. 4 is a production process drawing showing a producing method of the wired circuit board shown in FIG. 1, (a) showing the process of forming an insulating base layer with a predetermined pattern on a stiffener sheet, (b) showing the process of forming a conductive pattern and a heat radiating portion on the insulating base layer, (c) showing the process of forming an insulating cover layer with a predetermined pattern on the insulating base layer, to cover the whole conductive pattern except a terminal portion, (d) showing the process of forming a plating layer on the terminal portion, and (e) showing the process of etching the stiffener sheet to leave a portion of the wired circuit board where the mounting portion is arranged.

FIG. 1 is a plan view of an embodiment of a wired circuit board of the present invention, showing a principal part of a mounting portion for a semiconductor device to be mounted on. FIG. 2 is a sectional view of the principal part corresponding to FIG. 1. FIG. 3 is a sectional view of the principal part corresponding to FIG. 2, showing the mounted state of the semiconductor device.

As shown in FIG. 2, the wired circuit board 1 is in the form of a flexible wired circuit board, comprising a stiffener sheet 2 serving as a metal supporting layer, an insulating base layer 3 formed on the stiffener sheet 2, a conductive pattern 4 formed on the insulating base layer 3, and an insulating cover layer 5 formed on the insulating base layer 3, to cover the conductive pattern 4.

This wired circuit board 1 has a cover opening portion 6 which is formed in a specific portion of the insulating cover layer 5 and opened in a generally rectangular shape, as viewed from top, as shown in FIG. 1. The inside of this cover opening portion 6 serves as a mounting portion 7 for mounting thereon a semiconductor device S (See FIG. 3).

The stiffener sheet 2 is disposed in a portion of the wired circuit board 1 where the mounting portion 7 is provided, to stiffen the insulating base layer 3. The stiffener sheet 2 has a thickness of e.g. 15-150 µm, or preferably 18-30 µm.

The insulating base layer 3 is shaped like a band plate extending longitudinally of the wired circuit board 1 and is formed to have a uniform thickness of e.g. 3-20 µm, or preferably 7-12 µm (which is equivalent to thickness of an outside thick layer portion 10 and thickness of an inside thick layer portion 11 mentioned later), except a thin layer portion 9 mentioned later.

As shown in FIG. 2, the insulating base layer 3 has, at the mounting portion 7, a base opening portion 8 opened in a generally rectangular shape as viewed from top. It also has the thin layer portion 9 formed to surround the base opening portion 8.

The base opening portion 8 is formed in a center portion of the mounting portion 7 to have a shape generally similar to the shape of the mounting portion 7, extending through the insulating base layer 3 in the thickness direction.

The thin layer portion 9 is formed in a space between a marginal portion of the cover opening portion 6 and the base opening portion 8 and is shaped like a generally rectangular frame as viewed from top to surround the base opening portion 8. To be more specific, the thin layer portion 9 is formed between inside (the outside thick layer portion 10 mentioned later) spaced apart at a predetermined distance from a marginal portion of the cover opening portion 6 and outside (the inside thick layer portion 11 mentioned later) spaced apart at a predetermined distance from a marginal portion of the base opening portion 8. The thin layer portion 9 has a thickness of e.g. 1-15 µm, or preferably 1-8 µm.

As a result of this, the insulating base layer 3 has the mounting portion 7 in which the outside thick layer portion 10 shaped like a generally rectangular frame as viewed from top, the thin layer portion 9 located inside of the outside thick layer portion 10, the inside thick layer portion 11 shaped like a generally rectangular frame as viewed from top and located inside of the thin layer portion 9, and the base opening portion 8 located inside of the inside thick layer portion 11 are formed to be arranged in the sequence mentioned above from outside (marginal portion) toward inside (center), as shown in FIG. 1.

The conductive pattern 4 comprises a number of wirings 12 and is formed on the insulating base layer 3 to have a corresponding pattern for its intended purpose and application. The conductive pattern 4 has a thickness of e.g. 3-20 µm.

In the mounting portion 7, the conductive pattern 4 exposed from the cover opening portion 6 serves as terminal portions 13 to be connected with a semiconductor device S.

The terminal portions 13 are each formed in a wiring pattern in which the wirings are extended inwardly (toward the base opening portion 8) from each side (four sides) of the marginal portion of the cover opening portion 6. To be more specific, each terminal portion 13 comprises a number of wirings 12 arranged in parallel at spaced intervals in each of four areas extending from the respective sides (four sides) of the cover opening portion 6 toward the inside. A width W1 of each wiring 12 is set to be 10-300 µm, and a distance W2 between adjacent wirings 12 is set to be 10-300 µm. Also, free ends of the wirings 12 are located on the thin layer portion 9 and are formed in the form of a circular land to be connected with the semiconductor device S.

Each of the wirings 12 in each of the terminal portions 13 has an outside terminal portion 14 formed on the outside thick layer portion 10 and an inside terminal portion 15 formed on the thin layer portion 9, the outside terminal portion 14 and the inside terminal portion 15 being continuous with each other via a stepped portion 16 bent downwardly from the outside terminal portion 14 toward the inside terminal portion 15, as shown in FIG. 2.

The insulating cover layer 5 is formed on the insulating base layer 3 in such a manner as to cover the conductive pattern 4 and also form the cover opening portion 6 in the mounting portion 7. The insulating cover layer 5 has a thickness of e.g. 3-15 μm.

This wired circuit board 1 is provided, at the mounting portion 7, with a heat radiating portion 17 for radiating heat generated from the semiconductor device S mounted on the mounting portion 7.

The heat radiating portion 17 has a generally rectangular shape as viewed from top and is formed on the stiffener sheet 2 in the base opening portion 8 of the mounting portion 7. A lower end portion of the heat radiating portion 17 contacts with the stiffener sheet 2, and an upper end portion of the same protrudes upwardly from the base opening portion 8 and is formed to have a generally T section so that it can be placed on a top surface of the inside thick layer portion 11. The heat radiating portion 17 has a thickness (a length extending between the lower surface thereof contacting with the stiffener sheet 2 and the upper surface thereof) of e.g. 6-40 μm, or preferably 10-30 μm.

As a result of this, the heat radiating portion 17 is arranged in a center area defined by the wirings 12 of the terminal portions 13 extending from each side (four sides) of the marginal portion of the cover opening portion 6 inwardly (toward base opening portion 8), as shown in FIG. 1. In other words, the respective wirings 12 of the terminal portions 13 are arranged to surround the heat radiating portion 17.

Also, the surface of the heat radiating portion 17 and the surface of the outside terminal portion 14 are located higher in level than the surface of the inside terminal portion 15 (on the side thereof close to the insulating cover layer 5), as shown in FIG. 2. In other words, the surface of the inside terminal portion 15 is located lower in level than the surface of the surface of the outside terminal portion 14 and the surface of the heat radiating portion 17 (on the side thereof close to the stiffener sheet 2). To be more specific, a vertical interval G between the surfaces of the heat radiating portion 17 and outside terminal portion 14 and the surface of the inside terminal portion 15 is set to be e.g. 1-15 μm.

The surface of the heat radiating portion 17 and the surface of the outside terminal portion 14 are formed to be substantially equal in level to each other.

Also, plating layers 18 of nickel, gold, and the like are formed on surfaces of the wirings 12 of the terminal portions 13 and the surface of the heat radiating portion 17, respectively. The plating layers 18 are formed by a nickel plating layer of 1-5 μm thick, a gold plating layer of 0.05-5 μm thick, and the like.

Now, a producing method of this wired circuit board 1 is explained with reference to FIGS. 4-7. FIGS. 4-7 show sectional views corresponding to the sectional view of FIG. 2.

In this method, the insulating base layer 3 is formed on the stiffener sheet 2 to have a predetermined pattern, as shown in FIG. 4(a).

A metal foil or a thin metal sheet is used as the stiffener sheet 2. For example, stainless steel, 42-alloy, aluminum, copper-beryllium, phosphor bronze, and the like are used as the metal for forming the stiffer sheet. Preferably, a stainless foil is used in terms of rigidity, corrosion resistance, and workability.

No particular limitation is imposed on the insulating material used for forming the insulating base layer 3. For example, synthetic resins, such as polyimide resin, polyamide imide resin, acrylic resin, polyether nitrile resin, polyether sulfonic resin, polyethylene terephthalate resin, polyethylene naphthalate resin, and polyvinyl chloride resin, are used as the insulating material used for forming the insulating base layer 3. Of these synthetic resins, polyimide resin is preferably used in terms of heat resistance and chemical resistance. A photosensitive synthetic resin is also preferably used in terms of easiness in microfabrication of the wiring pattern. A photosensitive polyimide resin is further preferably used.

For example when photosensitive polyimide resin is used to form the insulating base layer 3 with a predetermined pattern on the stiffener sheet 2, the stiffener sheet 2 is prepared, first, as shown in FIG. 5(a). Then, a varnish of precursor of the photosensitive polyimide resin (photosensitive polyamic acid resin) is coated over the entire surface of the stiffener sheet 2, as shown in FIG. 5(b). Then, the coated varnish is heated at e.g. 60-150° C., or preferably at 80-120° C., to form a coating 19 of the precursor of the photosensitive polyimide resin.

Thereafter, the coating 19 is exposed to light through a photo mask 20, as shown in FIG. 5(c). The photo mask 20 has a predetermined pattern comprising light shielding portions 20a, semi-light-transmitting portions 20b and total-light-transmitting portions 20c. The semi-light-transmitting portions 20b permit light to transmit in a light transmission ratio properly selected from the range falling within 1-99%.

The photo mask 20 is disposed opposite the coating 19 so that the light shielding portions 20a confront portions of the coating 19 where the base opening portions 8 are to be formed in the insulating base layer 3 on the stiffener sheet 2; the semi-light-transmitting portions 20b confront portions of the coating 19 where the thin layer portions 9 of the insulating base layer 3 are to be formed on the stiffener sheet 2; and the total-light-transmitting portions 20c confront portions of the insulating base layer 3 (including the outside thick layer portions 10 and the inside thick layer portions 11) other than the thin layer portions 9 are to be formed on the stiffener sheet 2.

Radiation irradiated through the photo mask 20 has an exposure wavelength of 300-450 nm, and an integrated quantity of exposure light is in the range of 100-2,000 mJ/cm².

Then, after the coating 19 thus exposed is heated to a predetermined temperature, if necessary, it is developed, as shown in FIG. 5(d). When the exposed-to-light portion of the coating 19 irradiated is heated at a temperature in the range of e.g. 130° C. or more to less than 150° C., it is solubilized (positive pattern) in the next developing process. On the other hand, when heated at a temperature in the range of e.g. 150° C. or more to 200° C. or less, it is insolubilized (negative pattern) in the next developing process.

Figure 5:
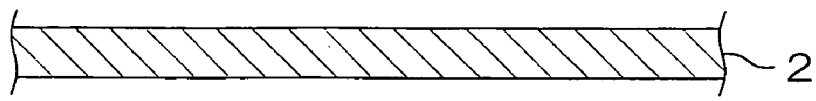
FIG. 5 is a production process drawing for explaining the process of forming the insulating base layer with a predetermined pattern on the stiffener sheet in FIG. 4(a), (a) showing the process of preparing the stiffener sheet, (b) showing the process of forming a coating of a precursor of a photosensitive polyimide resin on the entire surface of the stiffener sheet, (c) showing the process of exposing the coating to light through a photo mask, (d) showing the process of developing the coating exposed to light, and (e) showing the process of curing the coating.
Figure 5:
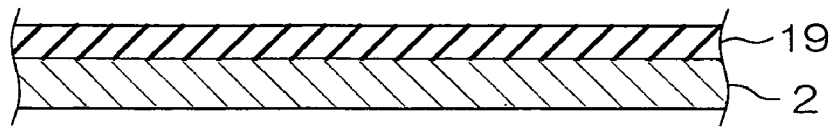
Figure 5:
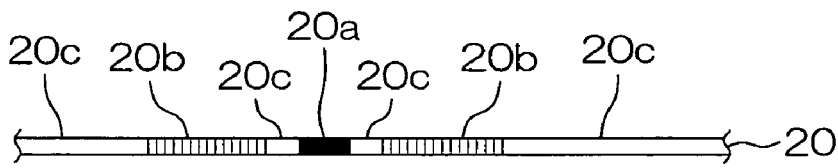
Figure 5:
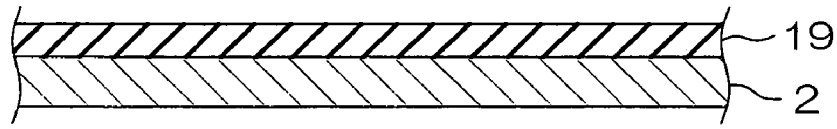
Figure 5:
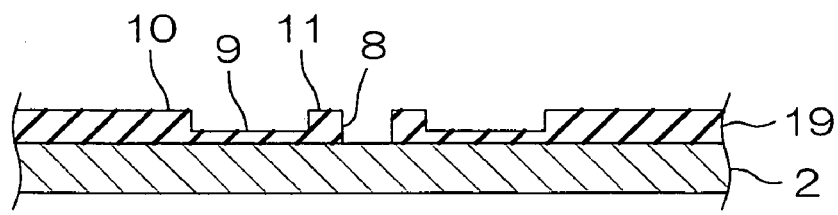

The development can be performed by any known method, such as a dipping process and a spraying process, using a known developing solution such as, for example, an alkaline developer. In this method, it is preferable that the negative pattern is formed in the coating 19. Illustrated in FIG. 5 is an embodiment using the process steps for forming the negative pattern.

As a result of this development, the coating 19 is formed in a predetermined pattern in which the portions thereof (including the outside thick layer portions 10 and the inside thick layer portions 11), which confronted the total-light-transmitting portions 20c of the photo mask 20, remain; the portions thereof for the base opening portions 8 to be formed, which confronted the light shielding portions 20a of the photo mask 20, melt; and the portions thereof for the thin layer portions 9 to be formed, which confronted the semi-light-transmitting portions 20b of the photo mask 20, melt at a residual ratio corresponding to the light transmittance.

Then, the coating 19 formed in a predetermined pattern is heated finally to e.g. 250° C. or more to be cured (imidized). As a result of this, the insulating base layer 3 of polyimide resin is formed in the predetermined pattern having the outside thick layer portions 10, the thin layer portions 9, the inside thick layer portions 11, and the base opening portions 8 formed at the corresponding portion thereof to the mounting portion 7, as shown in FIG. 5(e).

In the case where the photosensitive synthetic resin is not used, for example a dry film is bonded onto the stiffener sheet 2 by fusion bonding, or by adhesive bonding using an adhesive layer, if necessary, first. Then the dry film thus bonded is formed in a predetermined pattern having the outside thick layer portions 10, the thin layer portions 9, the inside thick layer portions 11, and the base opening portions 8 formed at the corresponding portions thereof to the mounting portions 7 by dry etching using plasma or laser, or by wet etching using an alkaline solution.

Then, the conductor layer 4 and the heat radiating portion 17 are formed simultaneously, as shown in FIG. 4(b). No particular limitation is imposed on the conductive material used for forming the conductive pattern 4 and the heat radiating portion 17. The conductive materials that may be used include, for example, copper, nickel, gold, solder, or alloys thereof Copper is preferably used in terms of electrical conductivity, availability at low cost, and workability.

The conductive pattern 4 and the heat radiating portion 17 are formed by a known patterning process, such as a subtractive process and an additive process. When the fine conductive pattern 4 is formed using a fine pitch technology, the additive process is preferably used.

In the additive process, a thin metal film 21 of a seed film is formed on the entire surface of the insulating base layer 3, first, as shown in FIG. 6(a). Chromium, nickel, copper, and alloys thereof are preferably used as the metal material used for forming the thin metal film 21. Though no particular limitation is imposed on the formation of the thin metal film 21, the thin metal film 21 is formed using e.g. a vacuum deposition process such as a sputtering process. The thin metal film 21 has thickness of e.g. 100-3,000 Å. The thin metal film 21 may be formed in multilayer by for example forming a thin chromium film and a thin copper film sequentially by the sputtering process.

Sequentially, in the additive process, a plating resist 22 having a reverse pattern to the conductive pattern 4 and the heat radiating portion 17 is formed on a surface of the thin metal film 21, as shown in FIG. 6(b).

The plating resist 22 may be formed in the form of the reverse pattern mentioned above to the conductive pattern 4 and the heat radiating portion 17 by a known process using a dry film photoresist, for example.

Then, the conductive pattern 4 and the heat radiating portion 17 are formed simultaneously on a surface of the thin metal film 21 exposed from the plating resist 22, as shown in FIG. 6(c). Though no particular limitation is imposed on the formation of the conductive pattern 4 and the heat radiating portion 17, for example electrolytic plating, or preferably electrolytic copper plating, is used for forming the conductive pattern 4 and the heat radiating portion 17.

Thereafter, the plating resist 22 is removed, as shown in FIG. 6(d). The plating resist 22 is removed by a known etching process, such as, for example, chemical etching (wet etching), or by stripping.

Then, the thin metal film 21 exposed from the conductive pattern 4 and the heat radiating portion 17 is removed, as shown in FIG. 6(e). The thin metal film 21 is removed by chemical etching (wet etching), for example.

Figure 6:
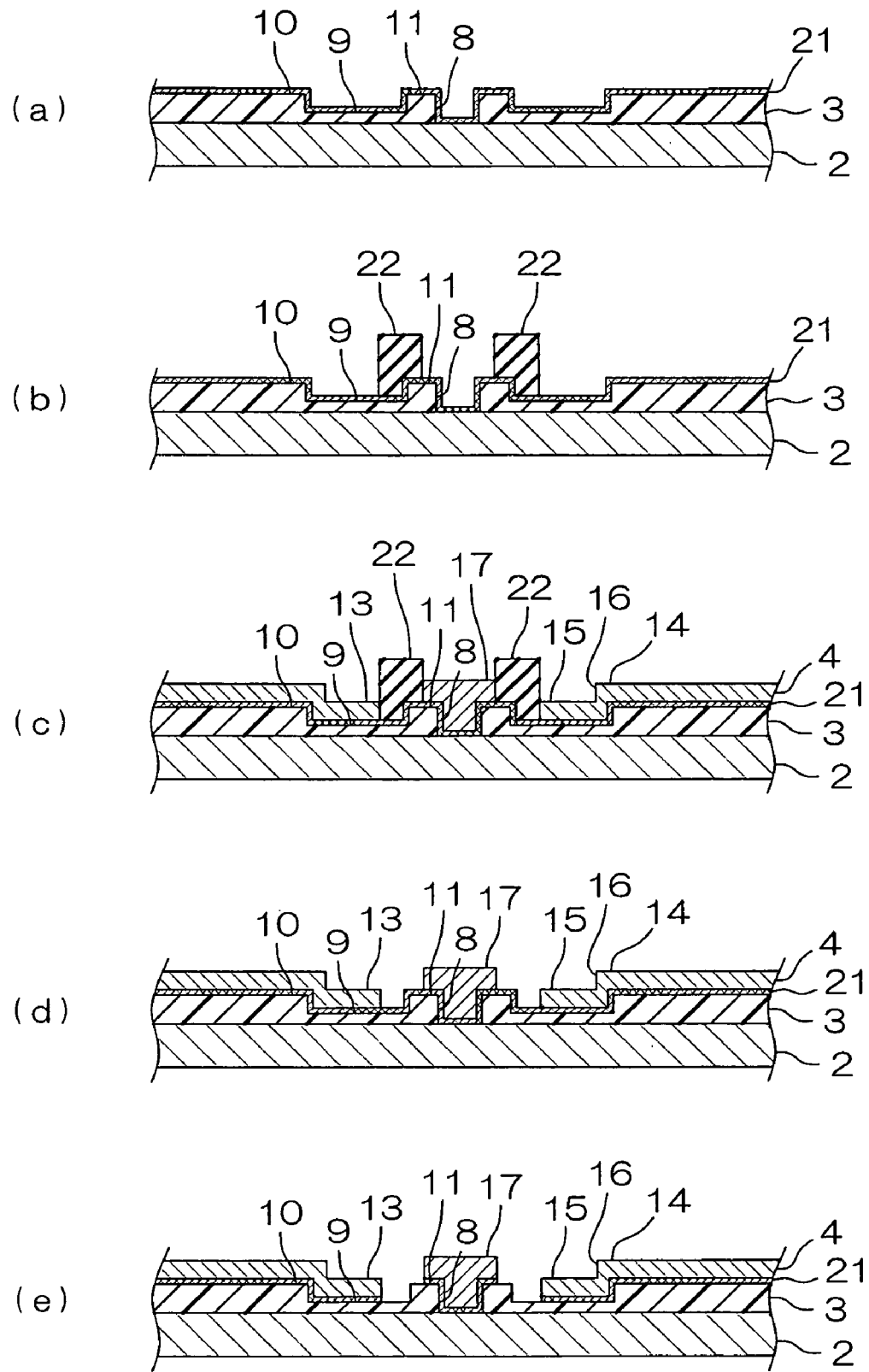
FIG. 6 is a production process drawing for explaining the process of forming the conductive pattern and the heat radiating portion on the insulating base layer in FIG. 4(b), (a) showing the process of forming a thin metal film on the entire insulating base layer, (b) showing the process of forming a plating resist on a surface of the thin metal film, (c) showing the process of forming the conductive pattern and the heat radiating portion on a surface of the thin metal film exposed from the plating resist, (d) showing the process of removing the plating resist, and (e) showing the process of removing the thin metal film exposed from the conductive pattern and the heat radiating portion.

As a result of this, the conductive pattern 4 including the terminal portions 13 mentioned above and the heat radiating portion 17 are formed. In FIGS. 2 and 3, the thin metal film 21 shown in FIG. 6 is omitted.

Sequentially, the insulating cover layer 5 of a predetermined pattern is formed on the insulating base layer 3, to cover the conductive pattern 4, except the terminal portions 13, as shown in FIG. 4(c).

The same insulating material as that for the insulating base layer 3 is used for forming the insulating cover layer 5. Preferably, photosensitive polyimide resin is used.

When the insulating cover layer 5 of the predetermined pattern is formed on the insulating base layer 3 using e.g. the photosensitive polyimide resin, a solution of precursor of the photosensitive polyimide resin (photosensitive polyamic acid resin) is coated over the entire surface of the insulating base layer 3 including the conductive pattern 4, as shown in FIG. 7(a), and then is heated at e.g. 60-150° C., or preferably at 80-120° C., to form a coating 23 of the precursor of the photosensitive polyimide resin.

Then, the coating 23 is exposed to light through a photo mask 24, as shown in FIG. 7(b). The photo mask 24 has a predetermined pattern comprising light shielding portions 24a and total-light-transmitting portions 24b.

The photo mask 24 is disposed opposite the coating 23 so that the light shielding portions 24a confront the cover opening portions 6 of the insulating cover layer 5 and the total-light-transmitting portions 24b confront the remaining portions of the insulating cover layer 5. The coating 23 is exposed to light in the same manner as the coating 19 mentioned above.

Figure 7:
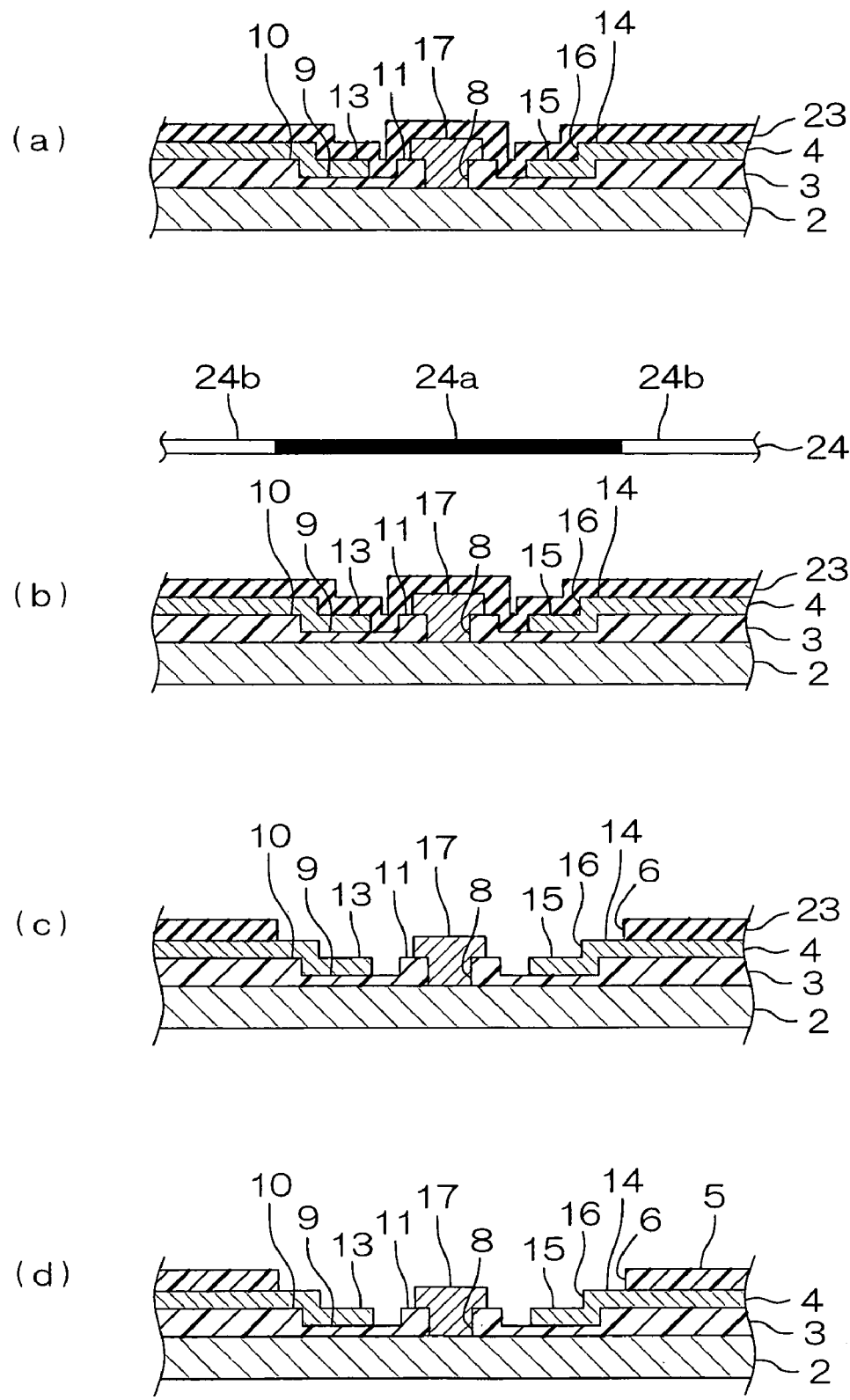
FIG. 7 is a production process drawing for explaining the process of forming the insulating cover layer with a predetermined pattern on the insulating base layer, to cover the whole conductive pattern except the terminal portion in FIG. 4(c), (a) showing the process of forming a coating on the entire surface of the insulating base layer including the conductive pattern and the heat radiating portion, (b) showing the process of exposing the coating to light through the photo mask, (c) showing the process of developing the coating, and (d) showing the process of curing the coating.

Then, after the coating 23 thus exposed is developed in the same manner as the coating 19, as shown in FIG. 7(c). In FIG. 7, the coating 23 is formed in the negative pattern.

As a result of this development, the coating 23 is formed in a predetermined pattern in which the portions thereof corresponding to the cover opening portions 6, which confronted the light shielding portions 24a of the photo mask 24, melt and the mounting portions 7 are exposed.

Then, the coating 23 formed in a predetermined pattern is heated finally to e.g. 250° C. or more to be cured (imidized). As a result of this, the insulating cover layer 5 of polyimide resin is formed in the predetermined pattern in which the mounting portions 7 are exposed from the cover opening portions 6 and the conductive patterns 4 are covered, except the terminal portions 13 disposed on the mounting portions 7, as shown in FIG. 7(d).

In the case where the photosensitive synthetic resin is not used, for example a dry film is bonded onto the insulating base layer 3 by fusion bonding, or by adhesive bonding using an adhesive layer, if necessary, first. Then the dry film thus bonded is formed in a predetermined pattern in which the mounting portions 7 are exposed from the cover opening portions 6 by dry etching using plasma or laser, or by wet etching using an alkaline solution and the conductive patterns 4 are covered, except the terminal portions 13 disposed on the mounting portions 7.

Thereafter, the plating layers 18 are formed on the terminal portions 13 and the heat radiating portion 17, to protect surfaces of the terminal portions 13, as shown in FIG. 4(d). No particular limitation is imposed on the plating material for forming the plating layers 18. For example, nickel and gold are used for forming the plating layers 18. The plating layers 18 are formed by the electrolytic plating or the electroless plating, with the portions of the mounting portions 7, except the surfaces of the terminal portions 13 and the heat radiating portion 17, covered with the plating resist.

The plating layer 18 may be formed in multilayer by, for example, plating the terminal portions 13 with nickel and gold sequentially.

Then, the stiffener sheet 2 is etched to leave its portions corresponding to the mounting portions 17 of the wired circuit board 1, as shown in FIG. 4(e). In the etching, after portions of the wired circuit board 1 corresponding to the portions of the stiffener sheet 2 to be left, are covered with the etching resist, the stiffener sheet 2 is subjected to the wet-etching using ferric chloride solution.

In the wired circuit board 1 thus obtained, the surface of the inside terminal portion 15 surrounding the heat radiating portion 17 in the mounting portion 7 is located lower in level than the surface of the heat radiating portion 17, as mentioned above. This construction can provide the result that even when bumps 25 of gold or solder are provided on the surface of the inside terminal portion 15 so that the semiconductor device S can be mounted via the bumps 25, the semiconductor device S mounted and the heat radiating portion 17 can be located closer to each other by an amount corresponding to the downward displacement of the surface of the inside terminal portion 15 with respect to the surface of the heat radiating portion 17. As a result of this, the semiconductor device S can be reliably mounted on the wired circuit board 1 by the flip chip mounting method, while also the heat generated from the semiconductor device S can be transferred to the stiffener sheet 2 effectively via the heat radiating portion 17. This can produce the result of providing improved heat radiating ability of the wired circuit board 1.

EXAMPLE

While in the following, the present invention will be described in further detail with reference to Example and Comparative Example, the present invention is not limited thereto.

Example 1

The stiffer sheet 2 of stainless steel (SUS304) having thickness of 20 µm was prepared (Cf. FIG. 5(a)).

Then, a solution of precursor of a photosensitive polyimide resin (photosensitive polyamic acid resin) was coated over the entire surface of the stiffener sheet 2. Then, the coated solution was heated for 2 minutes at 120° C., to form the coating 19 of the precursor of the photosensitive polyimide resin (Cf. FIG. 5(b)).

Thereafter, the photo mask 20 was disposed opposite the coating 19 so that the light shielding portions 20a confronted portions of the coating 19 where the base opening portions 8 were to be formed in the insulating base layer 3 on the stiffener sheet 2; the semi-light-transmitting portions 20b confronted portions of the coating 19 where the thin layer portions 9 of the insulating base layer 3 were to be formed on the stiffener sheet 2; and the total-light-transmitting portions 20c confronted portions of the insulating base layer 3 except the thin layer portions 9 were to be formed on the stiffener sheet 2. Then, the coating 19 was exposed to light with ultraviolet (an integrated quantity of exposure light of 720 mJ/cm$^2$ (Cf. FIG. 5(c)).

Then, after the coating 19 thus exposed was heated (for three minutes at 160° C.), it was developed using the alkaline developer, to form the coating 19 in a predetermined pattern comprising the base opening portions 8 and the thin layer portions 9 (Cf. FIG. 5(d)). Thereafter, the coating 19 was heated at 420° C. to thereby produce the insulating base layer 3 of polyimide resin having thickness of 10 µm (whose thin layer portion 9 has thickness of 5 µm (Cf. FIG. 5(e)). The base opening portion 8 was formed in a square, 2 µm on a side, as viewed from top.

The thin chromium film and the thin copper film were sequentially formed on the entire surface of the insulating base layer 3 by the sputtering process, to form the thin metal film 21 having thickness of 2,000 Å (Cf. FIG. 6(a)). Then, after the dry film resist was laminated on the surface of the thin metal film 21, the thin metal film 21 was exposed to light with ultraviolet (an integrated quantity of exposure light of 235 mJ/cm$^2$) and then developed by the alkaline developer, to form the plating resist 22 of a reverse pattern to the conductive pattern 4 and the heat radiating portion 17 (Cf. FIG. 6(b)).

Then, the conductive pattern 4 having thickness of 10 µm and the heat radiating portion 17 were formed on the surface of the thin metal film 21 exposed from the plating resist 22 (Cf. FIG. 6(c)) and, thereafter, the plating resist 22 was stripped (Cf. FIG. 6(d)). Then, the thin metal film 21 exposed from the conductive pattern 4 and the heat radiating portion 17 was removed by the chemical etching (Cf. FIG. 6(e)).

Then, the solution of precursor of the photosensitive polyimide resin was coated over the entire surface of the conductive pattern 4 and insulating base layer 3 and then was heated for two minutes at 120° C., to form the coating 23 of the precursor of the photosensitive polyimide resin (Cf. FIG. 7(a)).

Thereafter, the photo mask 24 was disposed opposite the coating 23 so that the light shielding portions 24a confronted the cover opening portions 6 of the insulating cover layer 5 and the total-light-transmitting portions 24b confronted the remaining portions of the insulating cover layer 5. Then, the coating 23 was exposed with ultraviolet (an integrated quantity of exposure light of 720 mJ/cm$^2$) (Cf. FIG. 7(b)).

Then, after the coating 23 thus exposed was subjected to the heating (for three minutes at 160° C.) after the exposure to light, it was developed by the alkaline developer. The coating 23 was formed in a predetermined pattern in which the mounting portions 7 were exposed from the cover opening portions 6 and all portions of the conductive pattern 4, except the terminals 13 disposed in the mounting portions 7, were covered (Cf. FIG. 7(c)). Thereafter, the coating 23 was heated at 420° C. to thereby form the insulating cover layer 5 of polyimide resin having thickness of 3 µm (Cf. FIG. 7(d)).

Thereafter, the plating layers 18 of 0.1 µm thick were formed on the terminal portions 13 by the electroless gold plating (Cf. FIG. 4(d)). Then, the stiffener sheet 2 was etched by wet etching using ferric chloride solution, to leave its portions corresponding to the mounting portions 17 of the wired circuit board 1 (Cf. FIG. 4(e)), thereby producing the wired circuit board 1.

In the wired circuit board 1 obtained, the surface of the inside terminal portion 15 was located 5 µm lower in level than the surface of the heat radiating portion 17.

Comparative Example 1

Except that the insulating base layer 3 having uniform thickness was formed without forming the thin layer portion 9 in the formation of the insulating base layer 3, the same method as in Example 1 was used to form the wired circuit board.

In the wired circuit board obtained, the surface of the inside terminal portion 15 was located on the same level with the surface of the heat radiating portion 17.

EVALUATION

The semiconductor devices were mounted on the mounting portions of the wired circuit board of Example 1 and the wired circuit board of Comparative Example 1, respectively, via gold bumps by the flip chip mounting method. Thereafter, the semiconductor devices were energized. The wired circuit board of Example 1 exhibited the good heat radiating ability so that the semiconductor device was operated in good condition, while on the other hand, the wired circuit board of Comparative Example exhibits the poor heat radiating ability so that the semiconductor device was sometimes operated in poor condition.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board that receives a semiconductor device thereon, comprising:
   a metal supporting layer;
   an insulating base layer formed on the metal supporting layer;
   an opening portion formed in the insulating base layer to expose the metal supporting layer;
   a channel formed in the insulating base layer proximate to the opening portion and along perimeter of the opening portion, wherein the channel is laterally displaced from an interface of the insulating base layer and the opening portion;
   a heat radiating portion that is formed in the opening portion, the heat radiating portion having a first surface that is coupled to the metal supporting layer and a second surface that is coupled to the semiconductor device;
   a conductive pattern formed on the insulating base layer and extending into the channel, the conductive pattern including a terminal portion for connection with the semiconductor device, wherein the terminal portion extends into the channel; and
   a mounting portion for mounting the semiconductor device thereon, wherein the opening portion and the terminal portion are located in the mounting portion.

2. The wired circuit board according to claim 1, wherein an upper surface of the terminal portion is located closer to the metal supporting layer than the second surface of the heat radiating portion.

3. The wired circuit board according to claim 2, wherein the upper surface of the terminal portion is located 1-15 μm closer to the metal supporting layer than the second surface of the heat radiating portion.

4. The wired circuit board according to claim 1, wherein an upper surface of the terminal portion that extends into the channel is located closer to the metal supporting layer than the second surface of the heat radiating portion.

* * * * *

UNITED STATES PATENT AND TRADEMARK OFFICE
CERTIFICATE OF CORRECTION

PATENT NO. : 7,271,347 B2  Page 1 of 1
APPLICATION NO. : 11/305120
DATED : September 18, 2007
INVENTOR(S) : Yasuhito Ohwaki It is certified that error appears in the above-identified patent and that said Letters Patent is hereby corrected as shown below:

In the claims, Column 11, line 33, between the words "along" and "perimeter" insert the word --a--.

Column 12, line 19, replace the claim reference number "1" with --3--.

Column 12, line 20, delete the first word, "an" and insert the word --the--; Also, between the words "located" and "closer" insert the measurement --1-15μm--.

Column 12, line 23, replace the claim reference number "2" with --1--.

Column 12, line 24, delete the first word "the" and insert the word --an--; Also, delete the measurement "1-15μm" that appears at the end of the line.

Signed and Sealed this

Eighteenth Day of December, 2007

JON W. DUDAS
*Director of the United States Patent and Trademark Office*